United States Patent [19]

Tsunoda et al.

[11] 4,118,233
[45] Oct. 3, 1978

[54] PHOTOSENSITIVE COMPOSITION FOR PRINTING SCREENS

[75] Inventors: Takahiro Tsunoda; Tsuguo Yamaoka, both of Funabashi, Japan

[73] Assignee: Murakami Screen Kabushiki Kaisha, Tokyo, Japan

[21] Appl. No.: 729,610

[22] Filed: Oct. 4, 1976

[30] Foreign Application Priority Data

Oct. 7, 1975 [JP] Japan ................................ 50-121045

[51] Int. Cl.$^2$ ............................................... G03C 1/68
[52] U.S. Cl. .................................... 96/115 P; 96/35.1; 96/38
[58] Field of Search ................ 96/115 R, 115 P, 35.1, 96/38

[56] References Cited

U.S. PATENT DOCUMENTS

| | | | |
|---|---|---|---|
| 2,902,365 | 9/1959 | Martin | 96/115 P |
| 3,070,442 | 12/1962 | Cohen et al. | 96/35.1 |
| 3,100,150 | 8/1963 | Chismar et al. | 96/93 |
| 3,278,304 | 10/1966 | Conix et al. | 96/115 P |
| 3,279,919 | 10/1966 | Laridon et al. | 96/35.1 |
| 3,630,746 | 12/1971 | Takimoto et al. | 96/115 P |
| 3,677,755 | 7/1972 | Fukui et al. | 96/35.1 |
| 3,801,328 | 4/1974 | Takimoto et al. | 96/115 P |

*Primary Examiner*—Edward C. Kimlin
*Attorney, Agent, or Firm*—Wenderoth, Lind & Ponack

[57] ABSTRACT

A photosensitive composition in solution for printing screens which comprises:

(a) a liquid medium selected from the group consisting of water-miscible organic solvents and solvent mixtures of said organic solvents and water;

(b) a polymer soluble in both said organic solvents and water; and (c) a sensitizer soluble in said organic solvents which is selected from the group consisting of photosensitive monomers and prepolymers thereof.

This composition makes it possible to produce presensitized printing screens of excellent preservability and printing resistance and to provide a process for efficiently producing pre-sensitized printing screens.

12 Claims, 4 Drawing Figures

PHOTOSENSITIVE COMPOSITION FOR PRINTING SCREENS

BACKGROUND OF THE INVENTION

The present invention relates to a photosensitive resin composition for printing screens. More specifically, it is concerned with a new photosensitive resin composition in solution including, as a sensitizer, a photosensitive vinyl monomer or prepolymer which has not been used hitherto as a material for the so-called direct process for producing printing screens, a presensitized printing screen produced therefrom, and a process for producing the same.

Photosensitive film materials for printing screens which have been heretofore used comprises an aqueous emulsion mixture of polyvinyl alcohol and polyvinyl acetate to which ammonium bichromate or diazo resins are added as a sensitizer. These photosensitive materials are very suitable for use in producing printing screens. However, they are unsatisfactory with respect to preservability. Further, the photosensitive materials containing bichromates as a sensitizer are limited in their use because of chromium pollution problems. At the present stage, diazo resins are being principally used as a sensitizer.

Diazo resins have excellent non-pollution property and preservability as compared with the bichromates, and when they are coated on a screen and dried to form a photosensitive film thereon, the film can be stored in cold and dark places for about one week. However, under the preservation conditions of normal temperature and humidity, a so-called dark reaction occurs, which makes even the non-exposed areas of the film insoluble in water. As a result, such a film becomes useless. Therefore, when the above mentioned photosensitive materials are used, coating, exposure and washout development operations must be carried out as rapidly as possible and in a continuous manner. Accordingly, there exist a great number of inconveniences in producing printing screens.

For example, when screen process printing is effected in a remote place in the production of electronic components, a printing screen is usually produced in situ, whereas coating of the photosensitive material onto screens may still be advantageously and conveniently carried out by a supplier of the photosensitive material for the printing screens. In this case, screens with a photosensitive film coated thereon (presensitized printing screen) must be delivered to an electronic component plant in a remote place. Accordingly, there is a demand for a photosensitive film for printing screens which can be safely stored under normal temperatures and humidities for a long period of time.

SUMMARY OF THE INVENTION

The inventors have found a photosensitive composition which can be used in a direct process for producing printing screens. When the photosensitive composition is stored as a photosensitive liquid, it is not necessary to provide a sensitizer and an aqueous polymer solution and to preserve them separately as is the case of a liquid photosensitive composition for printing screens using bichromates or diazo resins as a sensitizer. That is, the new liquid photosensitive composition can be stored as a mixture of an ethylenically unsaturated compound as a sensitizer and a polymer, and it is, therefore, very convenient from the standpoint of application.

In addition, when this photosensitive composition is formed into a photosensitive film, the film can be stably stored for a long period of time without deteriorating. By the use of this photosensitive composition, it becomes possible to produce a presensitized (printing) screen (hereinafter referred to as PSPS or PSS) which has been believed to be impossible to produce by the direct process. Further, it is possible to accomplish production of the PSPS and printing without great inconvenience even if the user of the PSPS is remote from a supplier of the PSPS.

According to one aspect of the present invention, there is provided a photosensitive composition in solution for printing screens which comprises:

(a) a liquid medium selected from the group consisting of water-miscible organic solvents and solvent mixtures of said organic solvents and water;

(b) a polymer soluble in both said organic solvents and water; and (c) a sensitizer soluble in said organic solvents which is selected from the group consisting of photosensitive monomers and prepolymers thereof.

According to another aspect of the present invention, there is provided a PSPS obtained by coating said photosensitive composition on a screen cloth and drying it, which PSPS has excellent preservability and printing resistance. That is, there is provided a PSPS comprising:

(1) a screen cloth and
(2) a solid solution layer coated on said screen cloth, which layer comprises:

(a) a polymer soluble in both water and water-soluble organic solvents; and (b) a sensitizer soluble in said water-soluble organic solvents which is selected from the group consisting of photosensitive monomers and prepolymers thereof.

According to still another aspect of the present invention, there is provided a so-called semidirect process for producing a PSPS from the above mentioned composition. That is, there is provided a process for producing a PSPS comprising the steps of (1) coating a photosensitive composition on one surface of a planar substrate, said composition comprising:

(a) a liquid medium selected from the group consisting of water-miscible organic solvents and solvent mixtures of said organic solvents and water;

(b) a polymer soluble in both said organic solvents and water; and (c) a sensitizer soluble in said organic solvents which is selected from the group consisting of photosensitive monomers and prepolymers thereof;

(2) coating one surface of a screen cloth with said photosensitive composition;

(3) bonding the coated planar substrate and the coated screen cloth under pressure in such a manner that the coated surfaces of the two materials face each other, thereby producing a laminate; and (4) removing only the planar substrate from the laminate.

The present invention will now be described in greater detail with reference to the accompanying drawings.

DETAILED DESCRIPTION

Figure 1:
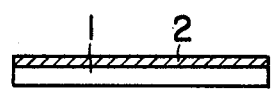
FIGS. 1 through 4 are diagrammatical views illustrating a series of process steps (in a semidirect process) for producing a PSPS with the use

The photosensitive composition of the present invention comprises basically three components, namely, a liquid medium, a polymer, and a sensitizer, and is characterized by being a uniform mixture in solution.

The term "liquid medium" as used herein designates a water-miscible organic solvent per se or a mixture of the organic solvent and water. It is preferable that the organic solvent content in the liquid medium be 30% by weight or higher, particularly from 40 to 75% by weight. Examples of water-miscible organic solvents usable in the invention are alcohols having from 1 to 4 carbon atoms, methyl cellosolve, ethyl cellosolve, butyl cellosolve, acetone, methyl ethyl ketone, methyl isobutyl ketone, dioxane, dimethyl formamide, and dimethyl sulfoxide.

Polymers usable in the present composition are those polymers which are soluble in both the above mentioned organic solvents and water. Examples of such polymers are partially saponified products of polyvinyl acetate, copolymers of vinyl acetate, and unsaturated acids (having from 3 to 4 carbon atoms) such as crotonic acid and partially sponified products thereof, polyethylene oxide, carboxymethyl cellulose, and vinylpyrrolidone. Of these compounds, the partially saponified products of polyvinyl acetate, the copolymers of vinyl acetate and the unsaturated acids, and the partially saponified products thereof are particularly useful.

In order to ensure that the above mentioned polymers are soluble in both water and the organic solvents, the polymers are limited in their degree of saponification and polymerization or their ratio of copolymerization. However, those skilled in the art can easily control the degree of saponification and polymerization of the polymer and the ratio of copolymerization so as to make the polymer soluble in both water and the above mentioned organic solvents. For example, polyvinyl acetate having a degree of saponification of 85 to 40% meets the above mentioned requirement, and a suitable example is a polyvinyl acetate with the trademark name Gosenol KH-17 (having a degree of saponification of 78.5 to 81.5%, manufactured by Nippon Gosei Kagaku Kogyo K.K., Japan). Another suitable polymer is a 40% hydrolyzed product of a copolymer of 97 mole % vinyl acetate and 3 mole % crotonic acid which is known under the trademark name Corponeel PK 40 manufactured by Nippon Gosei Kagaku Kogyo K.K.

It is preferable that the above described polymer in the composition be used in ratios such that the above mentioned liquid medium is 150 to 800 parts by weight, particularly 250 to 650 parts by weight, with respect to 100 parts by weight of the polymer.

The sensitizer to be added to the polymer is a monomer having a photosensitive ethylenically unsaturated group such as acryloyl, methacryloyl, allyl, vinyl ether, and acrylamide groups or their prepolymers having an average degree of polymerization of not greater than 5. Polyfunctional sensitizers having two or more of these photosensitive groups are particularly useful. Examples of such sensitizers are pentaerythritol triacrylate, pentaerythritol tetraacrylate, pentaerythritol trimethacrylate, pentaerythritol tetramethacrylate, 2,2-dibromomethyl-1,3-propanediol diacrylate, 2,2-dibromomethyl-1,3-propanediol dimethacrylate, 2,3-dibromopropyl acrylate, triallyl isocyanurate, methoxyethyl vinyl ether, t-butyl vinyl ether, and N,N'-methylenebisacrylamide, and prepolymers thereof. Of these sensitizers, pentaerythritol triacrylate, and tetraacrylate are particularly useful. It is preferable that these sensitizers be used in a quantity of 20 to 400 parts by weight, particularly 50 to 200 parts by weight, with respect to 100 parts by weight of the polymer.

The above mentioned limitation for the ratio of the above mentioned three components is preferable in order to ensure that the composition of the invention will be maintained in a uniform solution state.

Upon irradiation by ultraviolet rays, the sensitizer dissociates into radicals which themselves polymerize and cross-link to cause the photopolymerization of the polymer. In this case, the addition of a reaction initiator as described below promotes the dissociation of the sensitizer into radicals thereby to increase the degree of sensitization of the composition. Reaction initiators usable for the invention are those materials which will easily generate radicals upon exposure to radiation. Examples of these initiators are benzoin alkyl ethers, Michler's ketone, di-tert-butyl peroxide, dibenzothiazolyl disulfide, tribromoacetophenone, and anthraquinone derivatives such as tert-butyl anthraquinone. Among these compounds, benzoin alkyl ethers having from 1 to 4 carbon atoms in the alkyl group such as benzoin methyl ether are particularly useful. It is preferable that the initiator be used in a quantity of 1 to 20 parts by weight, particularly 3 to 15 parts by weight, with respect to 100 parts by weight of the sensitizer.

If an acrylate is used as a sensitizer, the resulting composition when formed into a photosensitive film will always be influenced by the oxygen in the air as is the case with all the other acrylate-type photosensitive resin compositions. Therefore, it may be advantageous to incorporate into the photosensitive composition an antioxidant such as, for example, hydroquinone, p-methoxyphenol, stannous chloride, or zinc chloride, as a stabilizer, or a wax. The addition amount of these additives is ordinarily not greater than 3% by weight of the total composition.

With regard to the use of a photosensitive resin comprising polyvinyl alcohols having an acrylate sensitizer added thereto as a photosensitive material for relief printing, patents issued to Nippon Paint K.K., for example, Japanese patent publication Nos. 42450/71, 26848/71, and 8041/75 and U.S. Pat. No. 3,801,328, already exist. Also, with regard to a photosensitive resin comprising cellulos acetate hydrosuccinate or an alkali-soluble polyvinyl alcohol derivative mixed with an acrylate, patents issued to E. I. Du Pont de Nemours & Co. Inc., for example, Japanese patent publication Nos. 342/60, 8495/60, 4112/61, 16078/61, 14657/62, 15810/63, 1112/64, and 2204/65, exist.

The differences between the inventions described in the above mentioned patents and the present invention will be discussed below. According to the patents to Nippon Paint K.K., after the exposure and hardening of the photosensitive resin layer, the washout development of the nonexposed areas is carried out by using water. Accordingly, the polyvinyl alcohol and acrylate used must be soluble in water. In order to mix a water-insoluble initiator with these materials, the initiator is first dissolved in any suitable organic solvent, and the solution is then mixed with the resin solution in the presence of a dispersing agent thereby to form an emulsion.

In the patents of E. I. Du Pont de Nemours & Co. Inc., in the case where an aqueous alkali solution is used in the washout development, the cellulose acetate hydrosuccinate or alkali-soluble polyvinyl alcohol is kneaded with the acrylates and initiator by means of two heat d rubber rollers and mechanically mixed. Because the photosensitive composition mixed by this method cannot comprises a uniform phase of the resin component, sensitizer, and initiator, it can produce a relief image without difficulty for a photosensitive layer adhering to a metal plate, such as a relief printing photosensitive layer, but when this photosensitive composition is used for a silk screen, the bonding between the screen mesh and the photosensitive resin due to photohardening is not satisfactory, so that it is impossible to produce a screen having a good printing resistance (wear resistance in repeated printing operations) which can be utilized in printing or textile printing.

According to the present invention, in order to obtain a photosensitive composition for a PSPS which permits washout development with water, adheres completely to a silk screen, and can be stored for a long period of time as a photosensitive material for silk printing screen, the polymer soluble in both the organic and water is used, and to the resulting solution are added the sensitizer and reaction initiator. In this manner, a photosensitive solution of the organic solvent wherein the three components dissolve and mix with each other can be obtained. By using this photosensitive solution, it is possible to obtain a photosensitive layer in a solid solution form most suitable for a silk printing screen.

Furthermore, it was found that when shellac such as, for example, shellac in the form of an emulsion such as Shellac SA #25 and Lacqcoat 50 (trademark name) manufactured by Nippon Shellac Kogyo K.K., Japan, was added to the photosensitive composition for a silk printing screen according to the invention, the printing resistance of the printing screen was improved. It is preferable that the addition of the shellac be carried out when an alcohol is used as the organic solvent. The shellac may be added up to 500 parts by weight, preferably 10 to 100 parts by weight with respect to 100 parts by weight of the polymer.

In printing of a pattern of a thick film integrated circuit requiring a resolving power of a line width of about 50 microns by a silk printing screen method, the filament constituting the mesh of the printing screen (the filament being made of fine silk, polyester or steel) may scatter the incident light during exposure and cause halation, which results in a reduction in the resolving power of the printed-out pattern. It was found that when a suitable antihalation dye was added to the photosensitive composition of the invention, the above mentioned phenomenon was prevented, and a remarkable increase in resolving power was provided. The antihalation dyes usable for the present invention are those dyes which are easily soluble in the above mentioned organic solvents and their mixtures with water, prevent halation, result in no subtantial reduction in the sensitivity of the composition, and have no polymerization inhibiting action. Examples of such dyes are CI Acid Yellow 25 (CI No. 18835), CI Acid Yellow 38 (CI No. 25135), CI Acid Orange 56 (CI No. 22895), CI Acid Orange 74 (CI No. 18745), CI Acid Brown 13 (CI No. 10410) and the like. The quantity of antihalation dye added is of the order of 0.1 to 5 parts by weight with respect to 100 parts by weight of the polymer.

The photosensitive composition of the invention may also be used in a so-called indirect method wherein the composition is applied onto any suitable substrate film and dried, and the coating of the composition on the substrate is exposed to light through a positive and developed to form an image on the substrate. Thereafter, the image is transferred and applied onto a screen cloth to produce a printing screen. However, when the photosensitive composition is applied onto any suitable screen cloth and dried to produce a PSPS, its excellent preservability can be effectively utilized. That is, the PSPS according to the second aspect of the invention has a photosensitive layer on a screen cloth which was obtained by applying the photosensitive composition thereonto and drying it. The photosensitive layer comprises a solid solution of the components of the composition from which the liquid medium has been substantially removed.

The screen cloth may be any conventional type and may be composed of silk, polyester, or steel. The thickness of the photosensitive layer may vary over a wide range, e.g., between 40 and 500 microns. The thickness of the photosensitive layer corresponds to the ink thickness when the screen is used as a printing screen, and it is also a characteristic of screen printing that the thickness of the photosensitive layer, that is, the ink thickness can be arbitrarily adjusted. However, in applying the so-called conventional direct process wherein the thickness of the photosensitive layer is progressively increased by repeated application and drying in order to obtain a uniform thickness of the photosensitive layer, more than ten application-drying cycles are required in order to produce a photosensitive layer having a thickness as thick as 100 microns, and this process is, therefore, inconvenient and uneconomical.

In contrast, the process for producing a PSPS according to the invention makes it possible to obtain a photosensitive layer having a thickness of the order of 100 microns repeating only a small number of application-drying cycles. This procedure is illustrated with reference to FIGS. 1 to 4.

Figure 2:
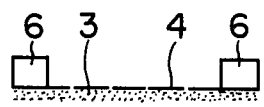
Figure 3:
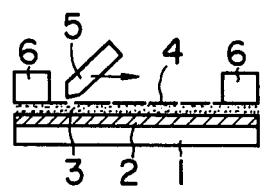
Figure 4:
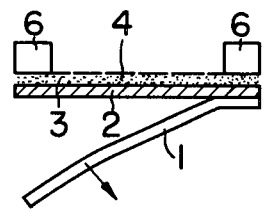

The photosensitive composition in solution of the invention is preliminarily applied onto a planar substrate 1 such as polycarbonate film, polyethylene film, or polyvinyl chloride film in a uniform thickness of about 80 microns, as is shown in FIG. 1. The resulting photosensitive resin film 2 is bonded with a non-dried screen cloth 4 with a photosensitive resin 3 of the same type coated thereon as is shown in FIG. 2. The bonding is carried out under pressure by using a squeegee 5 as shown in FIG. 3.

Thereafter, when the substrate 1 is removed from the composite, a PSPS is obtained which has the same effectiveness as that obtained when the photosensitive solution is applied onto the surface of the screen cloth 4. If necessary, after the application of the photosensitive resin composition onto the substrate or the pressure bonding using the squeegee as shown in FIG. 3, the composite is preferably dried in order to facilitate the separation of the substrate 1. The drying is preferably carried out at a temperature not greater than 60° C., particularly of the order of 30° to 50° C. The composite may be applied by any of the conventional methods such as brushing, bucketing, and spraying, and, if necessary, a superposition coating may be carried out additionally, thereby to adjust the thickness. Accordingly, it is not necessary to pay much attention to the thickness during the application state.

The above described procedure indicates that in the production of the printing screen, the photosensitive composition is applicable even to a so-called semidirect process. The conventional semidirect process comprises transferring a film having a non-photosensitive mixed emulsion of polyvinyl alcohol and polyvinyl acetate coated thereon onto a printing screen. Photosensitization is carried out by applying an aqueous polyvinyl alcohol solution previously sensitized with an aqueous bichromate or diazo resin solution onto the surface of the screen and transferring a non-sensitized polymer layer in the form of a film onto the non-dried surface of the screen. In this case, the sensitizer contained in the photosensitive layer coated on the screen diffuses and penetrates into the transferred non-sensitized polymer layer to effect the sensitization of the polymer.

In the conventional semi-direct process, satisfactory diffusion and penetration of the dichromates or diazo compounds into the polymer layer cannot be easily achieved. For this reason, the thickness of the polymer to be transferred is limited to about 70 microns with the dichromates and about 30 microns with the diazo sensitizers.

In order to obtain a printing screen with a thicker resin layer by means of semi-direct process, it is necessary to preliminarily sensitize a polymer layer on a substrate. However, due to the poor preservation performance of the bichromates or diazo resins as a sensitizer, a resin film containing these sensitizers coated on a substrate cannot be stored for a long period.

In contrast, if the photosensitive composition according to the invention is used as a transferring layer, it is possible to form a transferred photosensitive layer using the semidirect process regardless of the thickness of the layer and further possible to preserve the photosensitive layer in its state before the transferring. Because a vinyl monomer or a vinyl prepolymer containing a photosensitive vinyl group is used as a sensitizer in the photosensitive printing screen of the invention, it is not influenced by ambient temperature and humidity, and it does not deteriorate over several months when stored in the dark. Therefore, the photosensitive printing screen of the invention can be effectively used as a PSPS.

The PSPS thus produced is subjected to the same printing screen making operations as conventional operations. That is, a positive is overlapped on the photosensitive film and exposed to a mercury-arc lamp or the like. For example, when the laminate is exposed to a light source of a 3-KW mercury-arc lamp at a distance of 1 m for 2 minutes, the exposed resins of the laminate are hardened and become insoluble in water. The development is carried out with water at a temperature of 5° to 40° C., and, if necessary, completed by further spraying water to remove thoroughly any remaining resin of the non-exposed areas. Then, upon drying the developed laminate, a printing screen is obtained. The printing screen can be used in the same applications and uses as those of the conventional printing screen.

In addition, as mentioned hereinbefore, if an acrylate is used as a sensitizer, the sensitivity of the photosensitive film is inevitably increased during exposure to the influence of oxygen. Accordingly, in the case where the PSPS of the invention is not immediately used for producing the printing screen, the PSPS is preferably conditioned in a stream of an invert gas such as carbon dioxide or nitrogen for about 2 to 3 hours before printing of images thereby to remove oxygen from the photosensitive film. Alternatively, in order to prevent oxygen from affecting the photosensitive film, it is also possible to cover both surfaces of the photosensitive film with a thin plastic film or to form a film of a water-soluble polymer such as polyvinyl pyrrolidone and polyvinyl alcohol on the surface of the photosensitive film. For this purpose, a protective film having a thickness of 1 to 10 microns is satisfactory.

The utility and other features of the present invention will be concretely illustrated by the following examples, which are presented as illustrative only and are not intended to limit the scope of the invention. All quantities expressed in parts are parts by weight throughout these examples.

EXAMPLE 1.

| | |
|---|---|
| Corponeel PK-40 (manufactured by Nippon Gosei Kagaku Kogyo K.K.) (a 40% solution of a copolymer of 40% saponified polyvinyl acetate and crotonic acid (97:3) in a methanol-water solvent) | 80 parts (as resin) |
| Pentaerythritol triacrylate | 40 parts |
| Benzoin methyl ether | 4 parts |
| Methanol | 40 parts |
| Water | 30 parts |

The above listed photosensitive ingredients were stirred at room temperature, and completely dissolved and mixed with each other. The resulting solution was applied by means of a bucket onto polyester screens (225 mesh, tension of 8 kg/cm) spread over a metal or wood frame. This application comprised two or three superposed coatings according to the conventional method. Thereafter, the coating was dried with warm air at a temperature of 30° to 40° C. thereby to form a photosensitive film of 90 microns thickness. The resulting photosensitive screen did not deteriorate for several months when stored in the dark, and, thus, it may be used as a PSPS.

A positive film was overlapped on the photosensitive film by using a vacuum printing frame and exposed to a superhigh-pressure mercury-arc lamp of 8 Kw at a distance of 1 m for 2 minutes. The washout development of the resist image thus obtained was carried out in the following manner. The exposed screen was first immersed in water at 25° C. for 3 minutes to dissolve the major proportion of the non-exposed areas of the photosensitive film. Then water at 20° C. was sprayed on the surface of the photosensitive film at a pressure of 6 kg per cm$^2$ at a distance of 30 cm by means of a spray gun thereby to remove completely any remaining non-exposed areas. The screen was then dried with warm air at 45° C. for 30 minutes to produce a printing screen.

EXAMPLE 2

| | |
|---|---|
| Corponeel PK-40 (manufactured by Nippon Gosei Kagaku Kogyo K.K.) (a 40% solution of a copolymer of 40% saponified polyvinyl acetate and crotonic acid (87:3) in a methanol-water solvent) | 80 parts (as resin) |
| Pentaerythritol triacrylate | 40 parts |
| Shellac (SA#25, manufactured by Nippon Shellac K.K.) | 20 parts |
| Benzoin methyl ether | 4 parts |
| Methanol | 50 parts |
| Water | 80 parts |

The above enumerated ingredients were formed into a photosensitive composition in solution. By the same procedure as that described in Example 1, the resulting solution was applied onto a silk screen to produce a silk printing screen.

EXAMPLE 3

| | |
|---|---|
| Gosenol KH-17 (manufactured by Nippon Gosei Kagaku Kogyo K.K.) (polyvinyl alcohol having a degree of saponification of 78.5 to 81.5% and a degree of polymerization of 1700) | 10 parts |
| Pentaerythritol tetraacrylate | 10 parts |
| Sodium lauryl sulfate | 0.2 part |
| Benzoin methyl ether | 1 part |
| Methyl cellosolve | 45 parts |
| Water | 20 parts |

A photosensitive composition in solution prepared from the above mentioned ingredients was applied onto a silk screen by the procedure described in Example 1 thereby to produce a silk printing screen.

EXAMPLE 4

| | |
|---|---|
| Polyethylene oxide having a molecular weight of 30,000 (commercially available under the trademark name of PEO No. 3, manufactured by Seitetsu Kagaku Kogyo K.K.) | 15 parts |
| Pentaerythritol trimethacrylate | 14 parts |
| Michler's ketone | 1.4 parts |
| Stannous chloride (or zinc chloride or wax) | 0.15 part |
| Sodium lauryl sulfate | 0.3 part |
| Methyl cellosolve | 4.5 parts |
| Water | 22 parts |

A photosensitive composition in solution prepared from the above listed ingredients was applied onto a silk screen according to the procedure described in Example 1 thereby to produce a silk printing screen.

EXAMPLE 5

| | |
|---|---|
| Gosenol KP-08 (manufactured by Nippon Gosei Kagaku Kogyo K.K.) (polyvinyl alcohol having a degree of saponification of 71.5% and a degree of polymerization of 800) | 12 parts |
| Dibromoneopentyl glycol diacrylate | 5 parts |
| N-methylol acrylamide (or diacetone acrylamide) | 5 parts |
| Benzoin isopropyl ether | 1.2 parts |
| Sodium lauryl sulfate | 0.2 part |
| Methyl cellosolve | 25 parts |
| Water | 18 parts |

A photosensitive composition in solution prepared from the above listed ingredients was applied onto a silk screen by the procedure described in Example 1 thereby to produce a silk printing screen.

EXAMPLE 6

In this example, an antihalation dye was further added to the composition of Example 5.

| | |
|---|---|
| Gosenol KP-08 (manufactured by Nippon Gosei Kagaku Kogyo K.K.) (polyvinyl alcohol having a degree of saponification of 71.5% and a degree of polymerization of 800) | 12 parts |
| Dibromoneopentyl glycol diacrylate | 5 parts |
| N-methylol acrylamide (or diacetone acrylamide) | 5 parts |
| Benzoin isopropyl ether | 1.2 parts |
| Sodium lauryl sulfate | 0.2 part |
| Kayanol Meeling Orange G (manufactured by Nippon Kayaku K.K.; CI No. 22895) | 0.1 part |
| Methyl cellosolve | 25 parts |
| Water | 18 parts |

A photosensitive composition in solution prepared from the above mentioned ingredients was applied onto a silk screen according to the same procedures described in Example 1 thereby to produce a silk printing screen.

The preservability performance of the presensitized printing screens and the printing resistance of the printing screens obtained in Examples 1 through 6 are set forth in the following Table 1.

Table 1

| Example | Preservability Performance[1] (lines/mm) | | | Printing Resistance[2] (times) |
|---|---|---|---|---|
| | after 1 month | after 2 months | after 6 months | |
| 1 | 50 | 50 | 50 | 20,000 |
| 2 | 45 | 45 | 40 | 30,000 |
| 3 | 50 | 50 | 50 | 35,000 |
| 4 | 45 | 45 | 45 | 20,000 |
| 5 | 50 | 50 | 50 | 30,000 |
| 6 | 70 | 70 | 70 | 30,000 |

[1]The preservability performance set forth in Table 1 was measured as the resolving power (in the units of lines/mm) of the printing screen prepared according to the procedure described in the Examples from the PSPS after it had been stored in the dark for the indicated period of time.

[2]The printing resistance is expressed as the number of times of repeated printing operation which each of the printing screens withstood before the resolving power became practically unacceptable.

EXAMPLES 7 THROUGH 12

Each of the photosensitive compositions prepared by the recipes described in Examples 1 through 6 was applied with uniform thickness onto a polyester film by means of a roll coater or rotary applicator and dried, after which the coated film was stored in the dark. In use, each film was cut to the size of a screen and superposed on the screen from the outside of a screen frame under pressure.

In this case, when a photosensitive solution having the same composition as described in each of the examples was preliminarily coated on the surface to be applied of the screen with uniform thickness, and the photosensitive layer on the polyester film was superposed under pressure on the coated surface in a wet state, the photosensitive layer completely adhered to the screen. After removal of the polyester film, a negative film was overlapped on the photosensitive layer and exposed to light. Thereafter, the photosensitive layer was subjected to washout development. As a result, a good printing screen was obtained.

The presensitized printing screens and the printing screens obtained in Examples 7 through 12 were found to have good preservability and printing resistance almost identical to those obtained in Examples 1 through 6, respectively.

The photosensitive composition in each of Examples 7 through 12 was stored in the dark after it had been applied onto the polyester film until it was used for preparation of a PSPS.

We claim:
1. A photosensitive composition in solution for printing screens comprising:
 (a) a liquid medium selected from the group consisting of water-miscible organic solvents and solvent mixtures of said organic solvents and water;
 (b) a polymer soluble in both said organic solvents and water selected from the group consisting of partially saponified polyvinyl acetate and partially saponified copolymers of vinyl acetate and crotonic acid;
 (c) a sensitizer soluble in said organic solvents selected from the group consisting of pentaerythritol triacrylate and pentaerythritol tetraacrylate and their prepolymers having an average degree of polymerization of not greater than 5; and (d) an initiator soluble in said organic solvents and capable of generating a radical upon exposure to light, wherein said liquid medium is present in the range of 150 to 800 parts by weight and the sensitizer is present in the range of 20 to 400 parts by weight, respectively, with respect to 100 parts by weight of the polymer.

2. The composition of claim 1, wherein the polymer (b) is partially saponified polyvinyl acetate having a degree of saponification of 40 to 85%.

3. The composition of claim 1, wherein the polymer (b) is a partially saponified copolymer of vinyl acetate and crotonic acid.

4. The composition of claim 1, wherein the sensitizer (c) is pentaerythritol triacrylate.

5. The composition of claim 1, wherein the sensitizer (c) is pentaerythritol tetraacrylate.

6. The composition according to claim 1 wherein the liquid medium is present in the quantity range of 250 to 650 parts by weight and the sensitizer is present in the quantity range of 50 to 200 parts by weight, respectively, with respect to 100 parts by weight of the polymer.

7. The composition according to claim 1 wherein said organic solvent is selected from the group consisting of alcohols having from 1 to 4 carbon atoms, methyl cellosolve, ethyl cellosolve, butyl cellosolve, acetone, methyl ethyl ketone, methyl isobutyl ketone, dioxane, dimethylformamide, and dimethyl sulfoxide.

8. The composition according to claim 1 wherein said initiator is selected from the group consisting of benzoin alkyl ethers having from 1 to 4 carbon atoms in the alkyl group, Michler's ketone, di-t-butyl peroxide, dibenzothiazolyl disulfide, tri-bromoacetophenone, and t-butyl anthraquinone.

9. The composition according to claim 1 wherein said initiator is present in a quantity of 1 to 20 parts by weight with respect to 100 parts by weight of the sensitizer.

10. The composition according to claim 1 further comprising an antioxidant in a quantity of 0.01 to 5 parts by weight with respect to 100 parts by weight of the polymer.

11. The composition according to claim 10 wherein said antioxidant is selected from the group consisting of hydroquinone, p-methoxyphenone, stannous chloride, zinc chloride, and waxes.

12. The composition according to claim 1 further comprising shellac in a quantity of 10 to 100 parts by weight with respect to 100 parts by weight of the polymer.

* * * * *